United States Patent [19]
Nam

[11] Patent Number: 5,243,180
[45] Date of Patent: Sep. 7, 1993

[54] SOLID-STATE IMAGE SENSOR WITH PAIRED PHOTODIODE CONNECTED TO RESPECTIVE VERTICAL CCD CHANNELS

[75] Inventor: Jung H. Nam, Suweon, Rep. of Korea

[73] Assignee: Samsung Electronics Co., Ltd., Suweon, Rep. of Korea

[21] Appl. No.: 862,457

[22] Filed: Apr. 2, 1992

[30] Foreign Application Priority Data

Oct. 4, 1991 [KR] Rep. of Korea .................. 91-17403

[51] Int. Cl.⁵ ..................... H01J 40/14; H04N 3/14
[52] U.S. Cl. ........................ 250/208.1; 358/213.23
[58] Field of Search ................ 250/208.1, 211 J; 358/213.22, 213.23, 213.26; 357/30 H, 31, 32, 24; 257/232, 233, 291-293

[56] References Cited

U.S. PATENT DOCUMENTS

| 4,081,841 | 3/1978 | Ochi et al. ...................... 250/208.1 |
|---|---|---|
| 4,367,492 | 1/1983 | Harada et al. ................... 358/213.29 |
| 4,455,575 | 6/1984 | Murakoshi ...................... 358/213.22 |
| 4,760,273 | 7/1988 | Kimata ............................ 250/208.1 |
| 5,043,818 | 8/1991 | Yokoyama ...................... 358/213.23 |
| 5,121,214 | 6/1992 | Turko et al. .................... 358/213.26 |
| 5,122,649 | 6/1992 | Murayama et al. .............. 250/208.1 |

FOREIGN PATENT DOCUMENTS

| 0003278 | 1/1985 | Japan ............................... 358/213.22 |
|---|---|---|
| 1596359 | 9/1990 | U.S.S.R. ........................... 250/208.1 |

OTHER PUBLICATIONS

"A ⅓-inch 410,000-Pixel CCD Image Sensor with Feedback Field-Plate Amplifier", by Hajime Akimoto, et al., ISSCC91/Session 12/Friday, Feb. 15, 1991/Continental Ballroom 1-4/9:00 A.M.

"Generation Mechanism and Elimination of Fixed Pattern Noise in Dual-Channel Horizontal-CCD Register Image Sensor" by Kozo Orihara and Eiji Oda, IEEE Transactions on Electron Devices, vol. 35, No. 11, Nov. 1988.

Primary Examiner—David C. Nelms
Assistant Examiner—Michael Messinger
Attorney, Agent, or Firm—Ladas & Parry

[57] ABSTRACT

A solid-state image sensor of a CCD is disclosed, wherein the photodiodes in the photo-sensing part are arranged in regions separated horizontally. A vertical CCD channel is interposed between the photodiodes so that high resolution is achieved by increasing the horizontal resolution without any change of the driving pulse frequency or the charge handling capability.

7 Claims, 4 Drawing Sheets

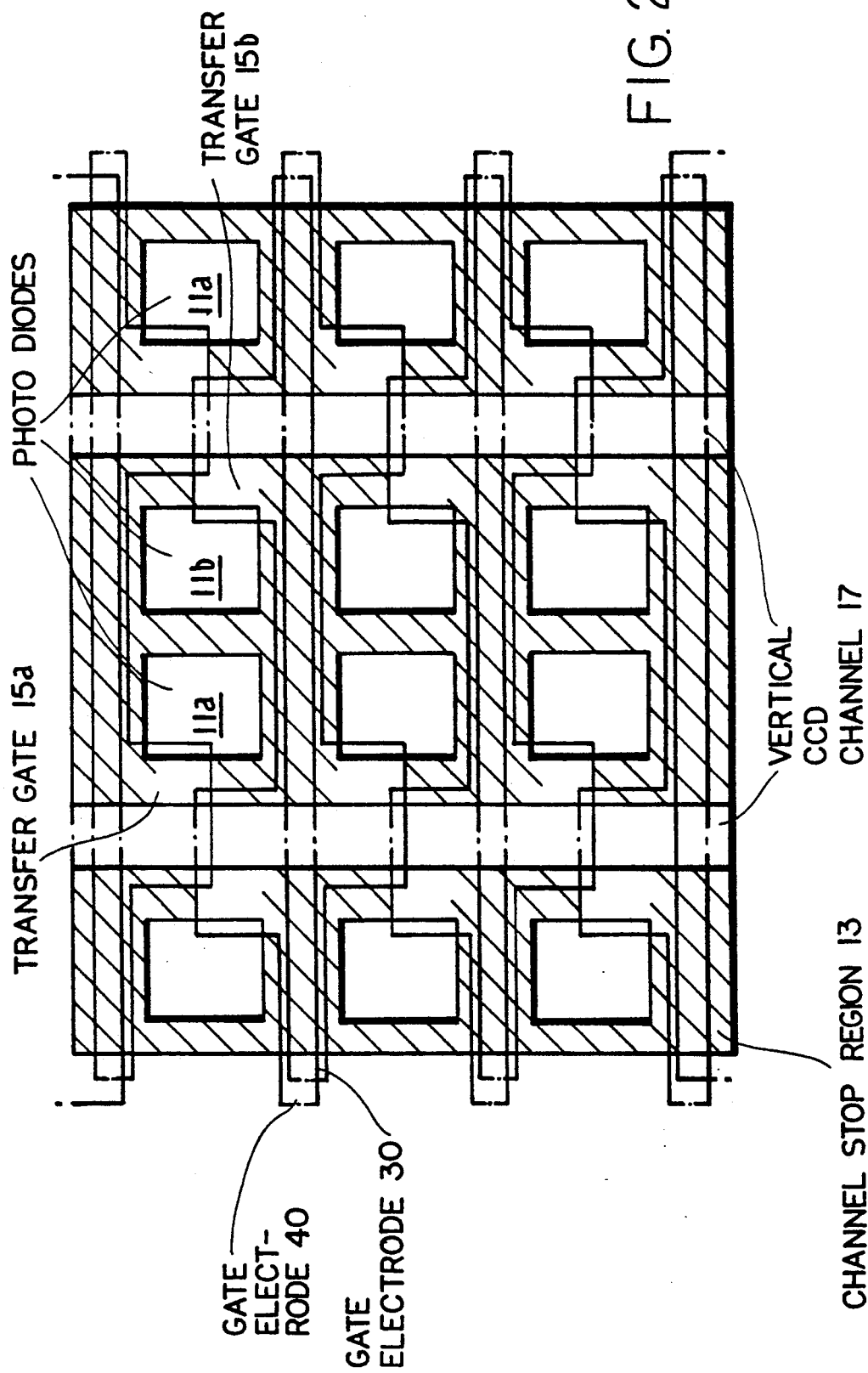

SOLID-STATE IMAGE SENSOR WITH PAIRED PHOTODIODE CONNECTED TO RESPECTIVE VERTICAL CCD CHANNELS

BACKGROUND OF THE INVENTION

1. Field of the Invention

The present invention relates to solid-state image sensors and, more particularly, to an interline-transfer CCD (Charge Coupled Device) image sensor for increasing horizontal resolution by varying the structure and array of photodiodes and vertical CCD channels to obtain higher resolution.

2. Background and Prior Art

The solid-state image sensors form images by transferring signals generated by light incident on photodiode cells to detection regions through the CCD.

Most of the presently used video processors utilize the interlaced scanning method. One frame of an image is made by both the first odd field scanning in sequence of 1, 3, 5, . . . , and the next even field scanning in sequence of 2, 4, 6, . . . The solid-state image sensors provide the sum signals of adjacent upper and lower photodiodes and these sum signals are combined in the odd and even fields.

Referring to two reports "Generation Mechanism and Elimination of Fixed Pattern Noise in Dual-Channel Horizontal-CCD Register Image Sensor", IEEE Transaction on Electron Devices, Vol. 35, No. 11, November, 1988 and "A ½-inch 410,000-pixel CCD Image Sensor with Feedback Field-Plate Amplifier", IEEE International Solid State Circuits Conference, pp. 208-209, 1991, the driving frequency of the horizontal CCD is increased as the solid-state image sensors achieve higher pixel density for higher resolution. It is, however, beyond the capacity of a CCD driver circuit and degrades the efficiency of charge transfer. Accordingly, a 2-stage horizontal CCD structure is employed in order to reduce the CCD driving frequency.

As seen in the above references higher pixel density is achieved by improvement of charge treatment, charge transfer and output amplifiers, but there still remain some problems since it has to be achieved within a predetermined chip area.

Also, even in the case of the 2-stage horizontal CCD structure case, fixed pattern noise is generated due to the characteristic difference between two horizontal CCD channels or between two output amplifiers.

FIGS. 1A to 1C are structural diagrams of a conventional interline-transfer CCD array.

Referring to FIG. 1A, signal charges generated in unit pixels by a light incident on each photodide 1 are simultaneously transferred to an adjacent vertical CCD channel 3. Then, the charges in the vertical CCD channel 3 are sequentially transferred downward in parallel. During this charge transfer period, the photodiodes 1 store the next charges. A horizontal CCD channel 5 is placed below the vertical CCD channel 3 for receiving the charges from the vertical CCD channel 3 to provide an output signal through an output amplifier 7.

FIGS. 1B and 1C show the position of the photodiodes and their combined output signals, respectively.

The stored charges in two adjacent photodiodes are added to each other and drawn out, where the combination of the two adjacent photodiodes is varied according to the scanning field. For example, if signals of 52+55, 58+61, etc., are provided in the first odd field, signals of 55+58, 61+64, etc., are provided in the next even field. Thus, the charge in each photodiode is provided for every field and added to the charge from the upper or the lower photodiode.

In this case, in order to enhance the horizontal resolution, more photodiodes have to be integrated, resulting in a problem that the areas of the vertical CCD channels and the photodiodes become more limited. Moreover, the driving frequency of the horizontal CCD channel is increased and thus other control and output circuits have to operate at a high speed.

SUMMARY OF THE INVENTION

The present invention provides a solid-state image sensor of a CCD, comprising a: photo-sensing part including two lines of photodiodes, transfer gates for transferring charges generated in the photo-sensing part to a vertical CCD channels, the vertical CCD channels transferring output charges from the transfer gates to an horizontal CCD channels according to driving pulse, the horizontal CCD channels for transferring the charges introduced from the vertical CCD channels to output part and an output amplifier for converting the transferred charges to a voltage signal.

BRIEF DESCRIPTION OF THE DRAWINGS

FIG. 2 shows a unit pixel of a solid state CCD image sensor according to the present invention.

DETAILED DESCRIPTION OF THE PREFERRED EMBODIMENT

Figure 1B:
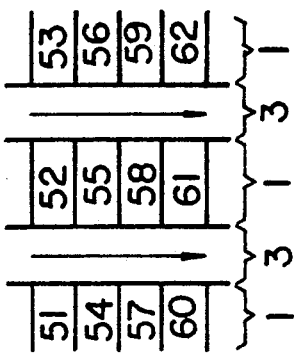
FIG. 1B shows the output signal positions of photodiodes in the CCD image sensor.
Figure 1C:
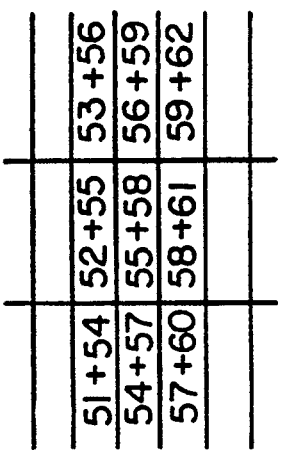
FIG. 1C shows the combination of the photodiode output signals displayed on a monitor.
Figure 1A:
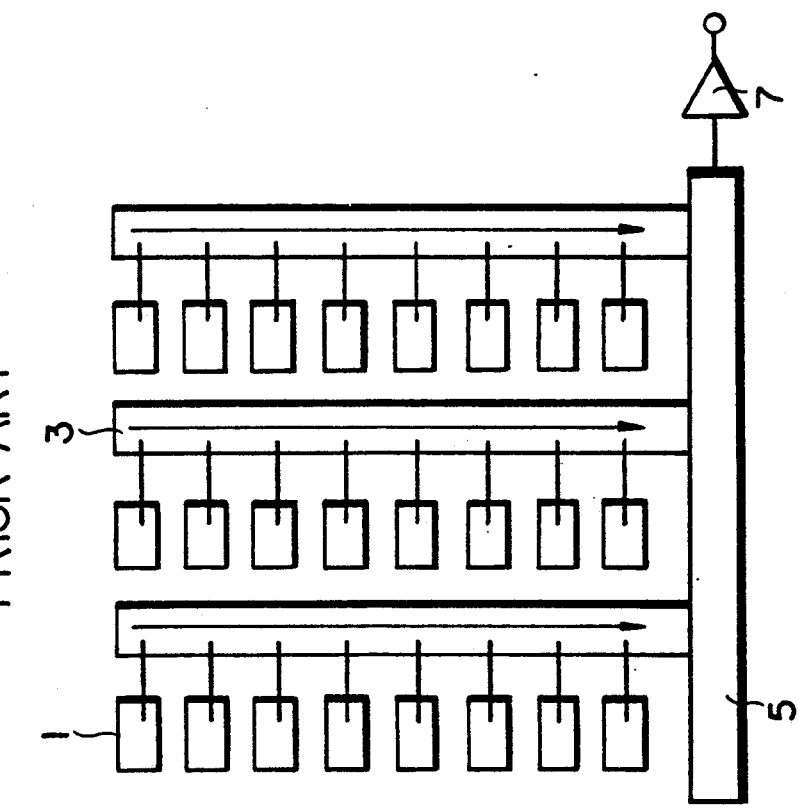
FIG. 1A shows a conventional interline-transfer CCD image sensor.

FIG. 2 shows a unit pixel in a solid-state CCD image sensor according to the present invention.

The unit pixel in FIG. 2 comprises a channel stop region 13 for isolating adjacent pixels, photodiodes 11a and 11b surrounded by the channel stop region 13, a vertical CCD channel 17, and transfer gates 15a and 15b for transferring charges generated in the photodiodes 11a and 11b to the vertical CCD channel 17.

The photodiodes 11a and 11b are isolated from each other by the channel stop region 13 along the vertical direction and connected to the vertical CCD channel 17 through the transfer gates 15a and 15b, respectively.

The charges in the photodiodes 11a and 11b are transferred to the vertical CCD channel 17 through the transfer gates 15a and 15b, respectively.

Gate electrodes 30 and 40 are coupled to the transfer gate regions. The gate electrode 30 corresponds to the first transfer gate 15a and the gate electrode 40 corresponds to the second transfer gate 15b.

Figure 3:
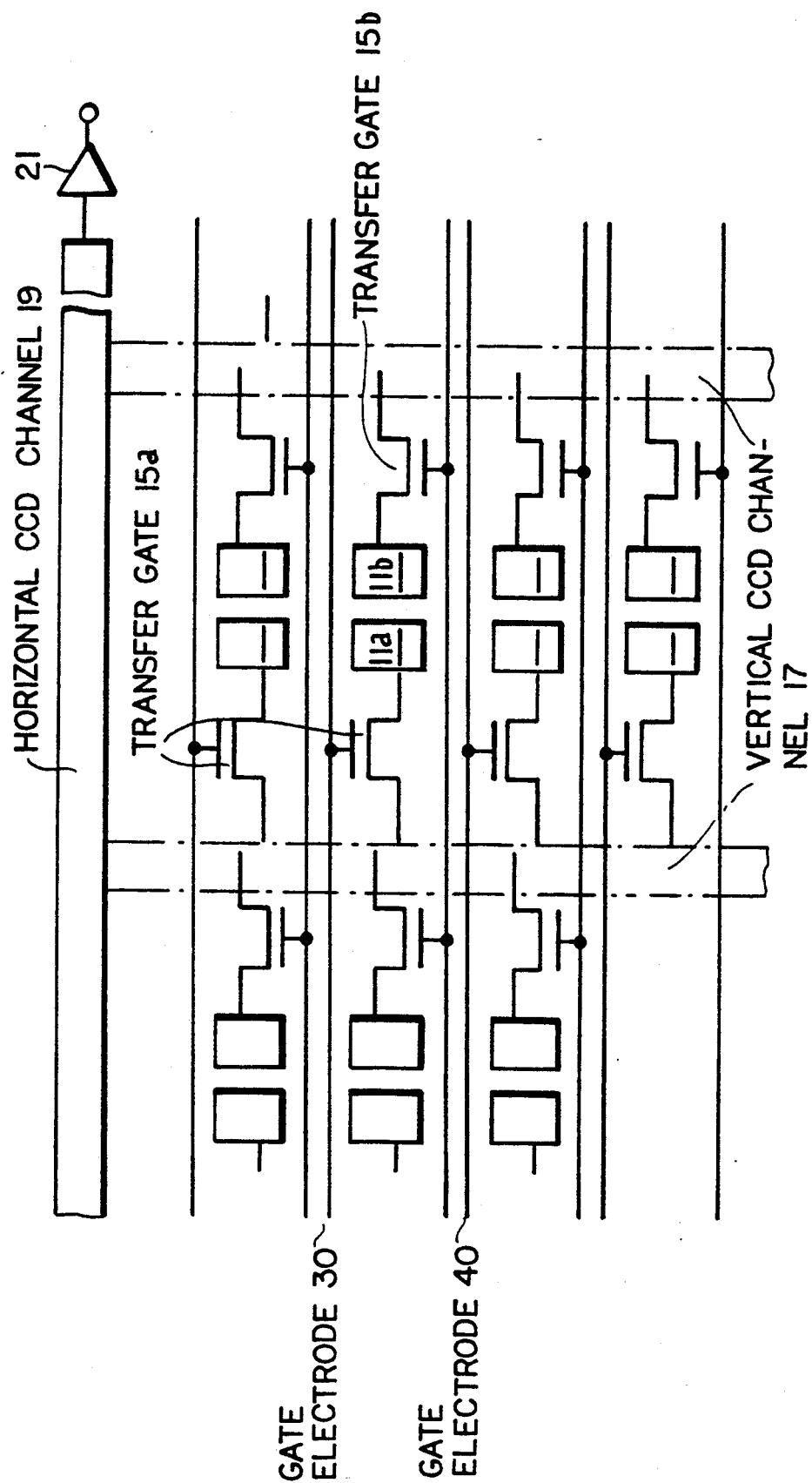
FIG. 3 is the circuit diagram showing the image sensor according to the present invention.

FIG. 3 is a circuit diagram showing the the unit pixel array in the solid state CCD image sensor in FIG. 2.

Referring to FIG. 3, the photodiodes 11a and 11b generate the charges in proportion to the intensity of an incident light and these charges are transferred to the vertical CCD channel 17 through the transfer gates 15a and 15b.

The charges in the vertical CCD channel 17 are transferred to a horizontal CCD channel 19 in parallel according to driving pulses applied to transfer electrodes. During the charge transfer from the vertical CCD channel 17 to the horizontal CCD channel 19, the photodiodes store the next charges. The charges in the horizontal CCD channel 19 are serially transferred to an output amplifier 21. Then, the output amplifier 21 generates an output voltage proportional to the transferred charge.

The charges in the photodiodes 11a and 11b can be transferred individually since the transfer gates 15a and 15b are included in the different gate electrode regions 30 and 40. Thus, in the odd and even fields, only one charge of two photodiodes in the unit pixel can be transferred and provided.

Figure 4B:
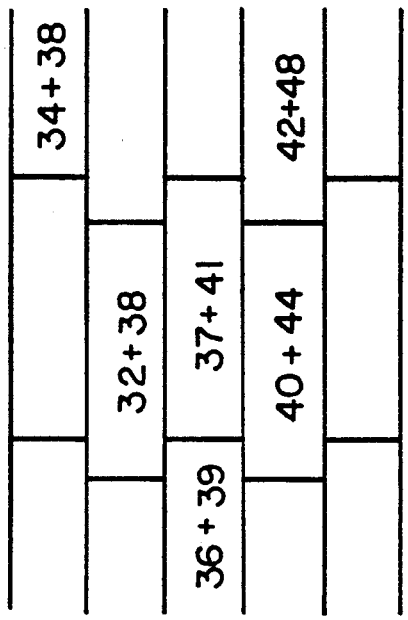
FIG. 4B shows the combination of the photodiode output signals displayed on a monitor.
Figure 4A:
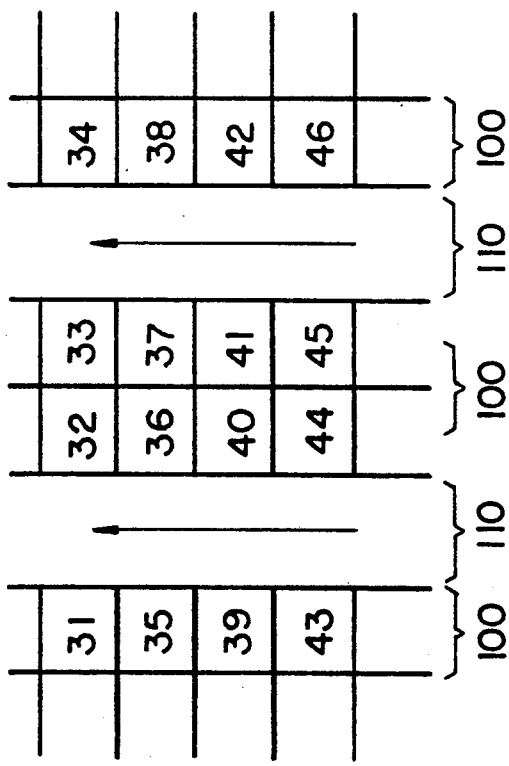
FIG. 4A shows the position of photodiodes in an interline-transfer CCD image sensor according to the present invention.

FIG. 4A shows the position of the photodiodes 100 and the vertical CCD channel 110.

The charges in the respective photo-sensing parts are provided by the combination of the upper and lower photodiodes 100 as shown in FIG. 4A, where the photodiodes are fixed individually for odd and even fields. In the conventional CCD structure, all signals from photodiodes are displayed on the monitor once per one field, if the upper photodiode output signals appear in the odd field, right-column photodiode output signals appear in the even field, or vice versa.

On the other hand, according to the present invention, the photodiode output signals appear in every field flexibly. Thus, each photodiode signal is read only once per one frame of image by simultaneous demodulation. The photodiodes for the odd field and the even field are positioned differently in the horizontal direction and the position of the respective photodiode signals displayed on the monitor is shown in FIG. 4B.

In the conventional interline-transfer CCD image sensor case, the vertical CCD channels are located between the adjacent photodiodes and the charge transfer gates are located in a constant direction, while in the present invention case, each photodiode in the unit pixel is horizontally divided into two parts, and one of them is transferred in the odd field and the other is transferred in the even field. Thus, according to the present invention horizontal resolution is increased without the change of the driving pulse frequency and driving capacity, by a new structure of the photodiode array and the vertical CCD channel thereby obtaining higher resolution.

What is claimed is:

1. A solid state image sensor comprising:
    a horizontal CCD channel,
    a plurality of vertical CCD channels connected to said horizontal CCD channel for sequential transfer of charges thereto,
    a plurality of photodiodes arranged between and connected to adjacent vertical CCD channels for producing charges generated by light and transferring said charges to said vertical CCD channels,
    transfer gates for transferring the charges from said photodiodes to said vertical CCD channels, and
    output means connected to said horizontal CCD channel for converting and outputting charges sequentially supplied thereto by said horizontal CCD channel,
    said photodiodes being arranged in two vertical lines of horizontally adjacent photodiodes between two successive vertical CCD channels, and
    channel stop means between said horizontally adjacent photodiodes for preventing interference therebetween, said transfer gates being arranged to transfer the changes from said horizontally adjacent photodiodes in said two vertical lines in alternation to respective different ones of said two successive vertical CCD channels so that each vertical CCD channel will transfer, in alternation, charges from photodiodes in vertical lines on opposite sides of said vertical CCD channel.

2. The image sensor according to claim 1, wherein the two vertical lines of photodiodes between successive vertical CCD channels respectively represent lines of odd and even photodiodes, each vertical CCD channel being connected to the line of odd photodiodes on one side thereof and the line of even photodiodes on the other side thereof.

3. The image sensor according to claim 2, wherein the photodiodes in said odd and even lines produce respective distinct output signals differing from one another.

4. The image sensor according to claim 2, comprising a plurality of unit pixels, each unit pixel being divided by said channel stop means into two said horizontally adjacent odd and even photodiodes.

5. The image sensor according to claim 4, wherein the odd and even photodiodes of each unit pixel are connected via respective said transfer gates to the different, respective vertical CCD channels between which the odd and even photodiodes are disposed.

6. The image sensor according to claim 1, wherein said photodiodes in said two lines are isolated whereby horizontal resolution is increased without change of driving frequency and driving capacity.

7. The image sensor according to claim 2, wherein the transfer gates are operated to feed to each vertical CCD channel combined signals from two photodiodes in successive horizontal rows in an adjacent odd line of photodiodes in alternation with combined signals from two photodiodes in successive horizontal rows in an adjacent even line of photodiodes.

* * * * *